United States Patent
Wu et al.

(10) Patent No.: US 9,583,383 B2
(45) Date of Patent: Feb. 28, 2017

(54) AIR GAP FORMING TECHNIQUES BASED ON ANODIC ALUMINA FOR INTERCONNECT STRUCTURES

(71) Applicant: Taiwan Semiconductor Manufacturing Co., Ltd., Hsin-Chu (TW)

(72) Inventors: Chia-Tien Wu, Taichung (TW); Tien-Lu Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/224,728

(22) Filed: Aug. 1, 2016

(65) Prior Publication Data

US 2016/0343606 A1    Nov. 24, 2016

Related U.S. Application Data

(60) Continuation of application No. 14/739,413, filed on Jun. 15, 2015, now Pat. No. 9,412,652, which is a division of application No. 14/151,158, filed on Jan. 9, 2014, now Pat. No. 9,076,790.

(51) Int. Cl.

| | |
|---|---|
| *H01L 23/48* | (2006.01) |
| *H01L 23/50* | (2006.01) |
| *H01L 29/40* | (2006.01) |
| *H01L 21/768* | (2006.01) |
| *H01L 21/02* | (2006.01) |
| *H01L 23/532* | (2006.01) |
| *H01L 23/528* | (2006.01) |

(52) U.S. Cl.
CPC .... *H01L 21/7682* (2013.01); *H01L 21/02178* (2013.01); *H01L 21/02258* (2013.01); *H01L 21/76829* (2013.01); *H01L 21/76843* (2013.01); *H01L 21/76849* (2013.01); *H01L 23/528* (2013.01); *H01L 23/5329* (2013.01); *H01L 23/53228* (2013.01); *H01L 23/53266* (2013.01)

(58) Field of Classification Search
CPC ........... H01L 23/5329; H01L 23/53295; H01L 23/5226; H01L 23/49894; H01L 23/522
See application file for complete search history.

(56) References Cited

U.S. PATENT DOCUMENTS

| | | |
|---|---|---|
| 5,387,888 A | 2/1995 | Eda et al. |
| 5,470,801 A | 11/1995 | Kapoor et al. |
| 6,139,713 A | 10/2000 | Masuda et al. |

(Continued)

OTHER PUBLICATIONS

Choi, et al. "Perfect two-dimensional porous alumina photonic crystals with duplex oxide layers." Journal of Applied Physics, vol. 94, No. 8, Oct. 15, 2003. 6 Pages.

(Continued)

*Primary Examiner* — Hoai V Pham
(74) *Attorney, Agent, or Firm* — Eschweiler & Associates, LLC (57) ABSTRACT

An aluminum (Al) layer is formed over a semiconductor substrate. A selective portion of the Al layer is removed to form openings. The Al layer is anodized to obtain an alumina dielectric layer with a plurality of pores. The openings are filled with a conductive interconnect material. The pores are widened to form air gaps and a top etch stop layer is formed over the alumina dielectric layer.

20 Claims, 7 Drawing Sheets

(56) References Cited

U.S. PATENT DOCUMENTS

| | | |
|---|---|---|
| 6,506,678 B1 | 1/2003 | Sukharev |
| 7,267,596 B2 | 9/2007 | Lambertini et al. |
| 2007/0001220 A1 | 1/2007 | Tombler, Jr. et al. |
| 2007/0118939 A1 | 5/2007 | Repetto et al. |
| 2008/0180883 A1 | 7/2008 | Palusinski et al. |
| 2014/0205805 A1 | 7/2014 | Takihara et al. |
| 2014/0264896 A1* | 9/2014 | Lu ................ H01L 23/5329 257/773 |

OTHER PUBLICATIONS

Jessensky, et al. "Self-organized formation of hexagonal pore arrays in anodic alumina." Applied Physics Letters, vol. 72, No. 10, Mar. 9, 1998. 3 Pages.

Abd-Elnaiem, et al. "Parametric Study on the Anodization of Pure Aluminum Thin Film Used in Fabricating Nano-pores Template." International Journal of Electrochemical Science, 8 (2013) 9741-9751, Jul. 1, 2013. 11 Pages.

Nielsch, et al. "Self-ordering Regimes of Porous Alumina: The 10% Porosity Rule." American Chemical Society, vol. 2, No. 7, Jul. 2002. 4 Pages.

Han, et al. "Control of the Anodic Aluminum Oxide Barrier Layer Opening Process by Wet Chemical Etching." American Chemical Society, Langmuir 2007, 23, 1564-1568, Dec. 19, 2006. 5 Pages.

Notice of Allowance dated Mar. 5, 2015 for U.S. Appl. No. 14/151,158.

Non-Final Office Action dated Nov. 19, 2015 for U.S. Appl. No. 14/739,413.

Notice of Allowance dated Apr. 11, 2016 for U.S. Appl. No. 14/739,413.

* cited by examiner

AIR GAP FORMING TECHNIQUES BASED ON ANODIC ALUMINA FOR INTERCONNECT STRUCTURES

REFERENCE TO RELATED APPLICATION

This Application is a Continuation of U.S. patent application Ser. No. 14/739,413 filed on Jun. 15, 2015 in the name of Chia-Tien Wu, et al., entitled "Air Gap Forming Techniques Based on Anodic Alumina for Interconnect Structures", which is a Divisional of U.S. application Ser. No. 14/151,158 filed on Jan. 9, 2014 (now U.S. Pat. No. 9,076,790 issued on Jul. 7, 2015), the contents of which are incorporated by reference in their entirety.

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photo-lithography, mask alignment, isolation and device performance among other factors. As the distance between any two adjacent conductive features decreases, the resulting capacitance increases, which will increase power consumption and time delay.

To reduce parasitic capacitance and correspondingly improve device performance, IC designers utilize low-k dielectrics. One kind of low-k material is produced by creating large voids or pores in a dielectric. Voids can have a dielectric constant of nearly 1, thereby reducing the overall dielectric constant of the porous material by increasing the porosity of the material. Large pores, also referred to as air gaps, can provide an extremely low-k dielectric between the two conductive features.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

The existence of air gaps in low-k dielectrics can help to reduce an overall k value of the dielectrics. However, it is challenging further reducing the k value by increasing the volume of a single air gap or the density of air gaps considering requirements for the mechanical strength and the photolithography accuracy. The present disclosure relates to interconnect structures where a porous anodic alumina dielectric layer (for example, $Al_2O_3$) is applied as a low-k material. The alumina dielectric layer is initially formed with air-filled pores therein, and at least some of these air-filled pores are widened to form air gaps in the alumina dielectric layer. Because this alumina dielectric layer has a significant number of air gaps therein, it can provide a low-k value. For example, in some embodiments, the alumina dielectric layer can have an effective dielectric constant value is smaller than approximately 1.8. At the same time, the strong mechanical strength of the alumina structure provides a relative strong dielectric layer on which interconnect layers and/or device features can be built. Further, in some embodiments, self-aligned alumina anodizing processes can be beneficial in that they limit the amount of alignment required at some stages in manufacturing.

Figure 1A:
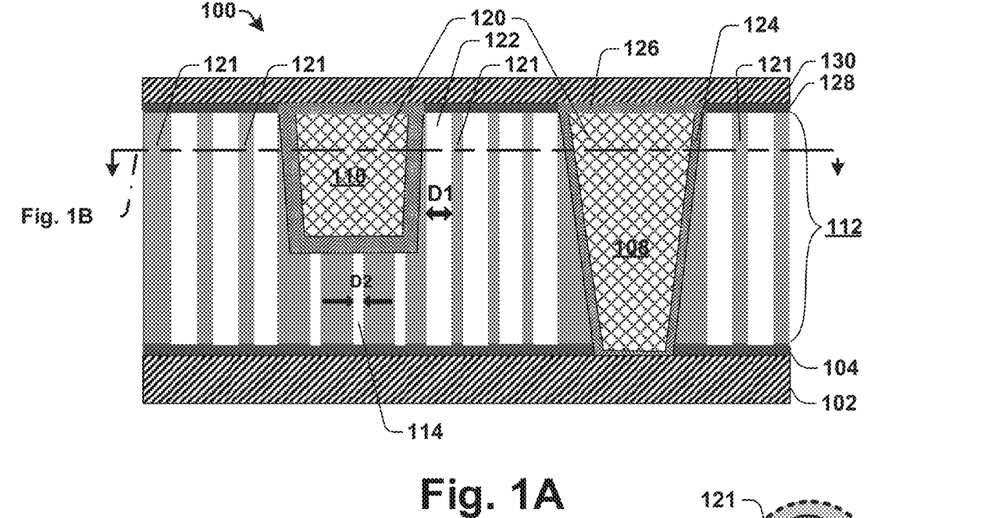
FIG. 1A illustrates a cross-sectional view of an interconnect structure in accordance with some embodiments.
Figure 1B:
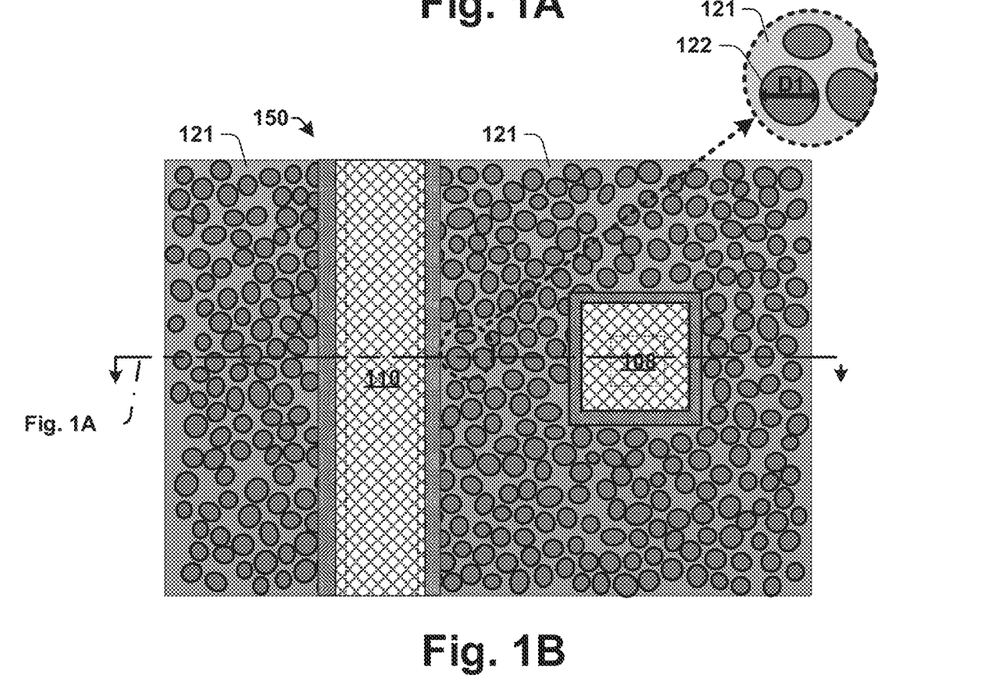
FIG. 1B illustrates a top view of the interconnect structure of FIG. 1A in accordance with some embodiments.

FIG. 1A illustrates a cross-sectional view 100 of some embodiments of an interconnect structure of a semiconductor device, and FIG. 1B shows a corresponding top view 150. A first conductive layer 102 is over a semiconductor substrate (not shown). An alumina dielectric layer 112 is disposed over the first conductive layer 102. The alumina dielectric layer 112 includes an alumina matrix 121 and a plurality of air gaps, for example, 122. The air gaps are substantially perpendicular to a surface of the semiconductor substrate. A conductive body 108 is disposed in the alumina dielectric layer and electrically connects the first conductive layer 102 to a second conductive layer 130 over the alumina dielectric layer 112. In some embodiments, a bottom etch stop layer 104 is disposed between the first conductive layer 102 and the alumina dielectric layer 112. Another top etch stop layer 128 can be disposed between the alumina dielectric layer 112 and the second conductive layer 130.

In some embodiments, the first conductive layer 102 is an interconnecting metal layer that can be one of multiple metal layers of the interconnect structures. In some other embodiments, the first conductive layer 102 can be active regions of devices disposed over or in the semiconductor substrate. For example, the first conductive layer can be source/drain regions of a FET device. The second conductive layer can also be an interconnecting metal layer, or can be a bond pad, solder bump or some other conductive layer.

In some embodiments, average diameters of the plurality of air gaps, for example, D1 of the air gap 122 is approximately 9 nm. A volume density of the plurality of air gaps to the alumina dielectric layer can be larger than around 70%. Notably, in some embodiments, there is a region in the alumina dielectric layer 112 where a plurality of pores (e.g., 114) is disposed. The pores (e.g., 114) and air gaps (e.g., 122) can be columnar in that sidewalls of a given pore/air gap can extend substantially vertically between top and bottom surfaces of alumina dielectric layer 112, where a given pore/air gap can have a substantially constant diameter between top and bottom surfaces of alumina dielectric layer 112. Respective diameters of the plurality of pores are smaller than the respective diameters of the plurality of air gaps. For example, a pore 114 that is substantially perpendicular to the surface of the semiconductor substrate is disposed in a lower portion of the alumina dielectric layer that is under a trench 110 disposed in an upper portion of the alumina dielectric layer with a diameter D2 approximately 3 nm. The conductive body 108 can be a via as shown in FIG. 1 or a dual damascene structure similar to 308 shown in FIG. 3i. The conductive body 108 couples a first metal line in the first conductive layer 102 and a second metal line in the second conductive layer 130. It will be appreciated that the relative sizes of the air gaps (e.g., 122), pores (e.g., 114), and conductive bodies 108, 110, illustrated in FIG. 1A-1B are merely illustrative and that the relative sizes of these features can vary widely from what is shown.

Figure 2:
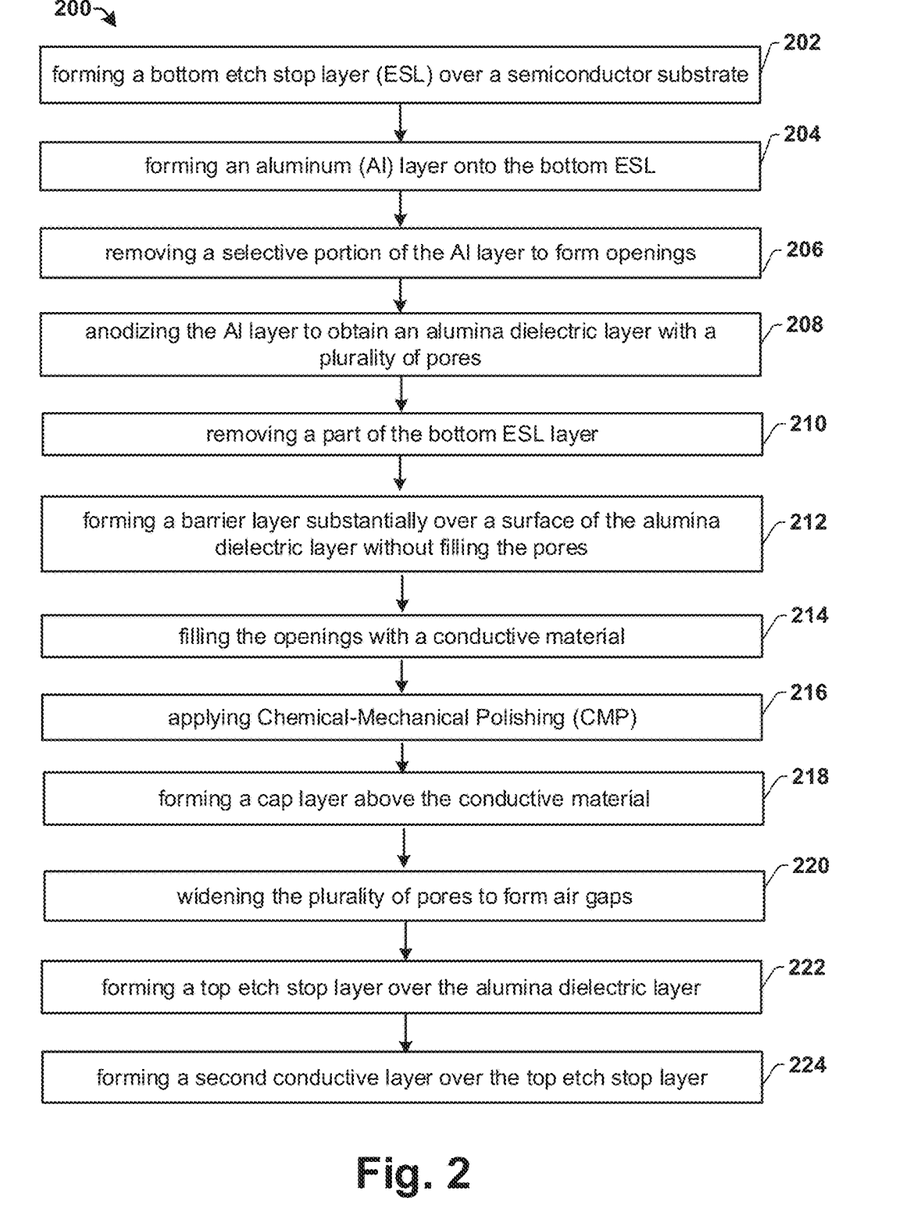
FIG. 2 illustrates a flow diagram of a method of forming an air gap for interconnect structures in accordance with some embodiments.

FIG. 2 illustrates a flow diagram of some embodiments of a method of forming an air gap for interconnect structures.

While disclosed methods (e.g., methods 200) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a bottom etch stop layer (ESL) is formed over a semiconductor substrate. The semiconductor substrate may comprise any type of semiconductor material including a bulk silicon wafer, a binary compound substrate (e.g., GaAs wafer), or higher order compound substrates, with or without additional insulating or conducting layers formed thereover, among others.

At 204, an aluminum (Al) layer is formed onto the bottom ESL. In some embodiments, for example, the Al layer has a thickness of from about 1000 Å to about 10000 Å. The Al layer can be deposited by physical vapor deposition (PVD).

At 206, a selective portion of the Al layer is removed to form openings. In some embodiments, the openings comprise some trenches which extend along a horizontal surface of the semiconductor and some vias which extend vertically through the Al layer. In some embodiments, dual damascene structure is patterned during this step by via first, trench first or self-aligned process.

At 208, the Al layer is anodized to obtain an alumina dielectric layer with a plurality of pores. In some embodiments, preparation conditions, for example, annealing to enhance grain size and to obtain homogeneous conditions for pore growth over large areas, or electropolishing to improve surface roughness are applied. In some embodiments for example, an anodizing voltage of about 5 V is applied and a copper plate is applied over the Al layer as a cathode. An electrolyte solution may comprise Hydrogen peroxide ($H_2O_2$), Phosphoric acid ($H_3PO_4$) or Sulfuric Acid ($H_2SO_4$) is applied. The anodizing process can be applied by more than one step of anodizing in different conditions with different electrolyte. For example, a 1.8 M Sulfuric Acid ($H_2SO_4$) aqua-solution is applied as an electrolyte. A temperature of around 5° C. is applied during anodizing. A substantially ordered plurality of pores with a diameter of about 3 nm is achieved.

At 210, a part of the bottom ESL that is under a bottom surface of the openings is removed.

At 212, a barrier layer is formed substantially over a surface of the alumina dielectric layer without filling the pores.

At 214, a conductive interconnect material, for example, copper, is filled to the openings.

At 216, a Chemical-Mechanical Polishing (CMP) process is applied to smooth surfaces and remove a top part of the conductive interconnect material that is not needed.

At 218, a cap layer is formed above the filled conductive interconnect material. The cap layer can help to protect the filled conductive interconnect material from subsequent chemical reaction processes.

At 220, the plurality of pores are widened to form air gaps. In some embodiments, a wet etching process comprising a wet etchant may be applied within a processing chamber held at a temperature of from approximately 0° C. to approximately 50° C. For example, the wet etchant may comprise Phosphoric acid ($H_3PO_4$) or Sulfuric Acid ($H_2SO_4$). Diameters of the widened pores are related to but not limited to temperature, time of reaction and chemical concentration. For example, in some embodiments, the workpiece can be subjected to a 5% (by weight) $H_3PO_4$ solution at 25° C. for approximately 5 minutes, which can widen pores to about 9 nm in diameter, on average.

At 222, a top etch stop layer is formed over the alumina dielectric layer.

At 224, a second conductive layer is formed over the top etch stop layer.

FIGS. 3a-3i illustrate some embodiments of cross-sectional views and corresponding top-sectional views of a semiconductor substrate showing a method of forming an air gap for interconnect structures. Although FIGS. 5-13 are described in relation to method 200, it will be appreciated that the structures disclosed in FIGS. 3a-3i are not limited to such a method.

Figure 3A:
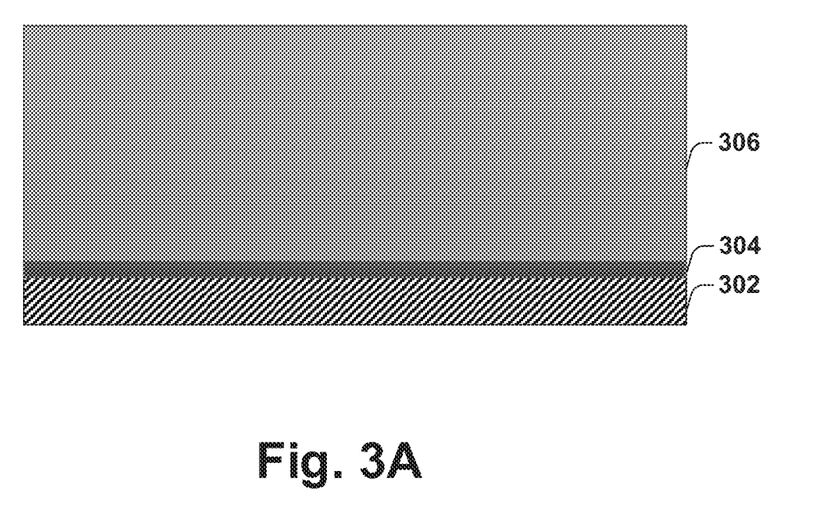
FIGS. 3A-3I illustrate cross-sectional views of a semiconductor substrate showing a method of forming an air gap for interconnect structures in accordance with some embodiments.

As shown in FIG. 3a, a bottom etch stop layer (ESL) 304 is formed over a semiconductor substrate and an aluminum (Al) layer 306 is formed onto the bottom ESL 304. A previous layer 302 can be either a conductive layer or a dielectric layer formed previously.

Figure 3B:
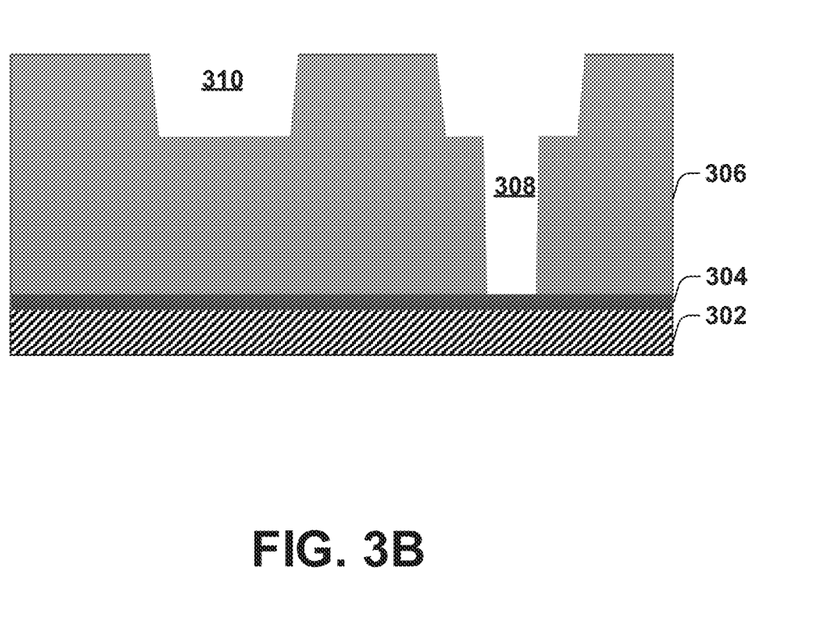

As shown in FIG. 3b, a selective portion of the Al layer 306 is removed to form openings. In some embodiments, the openings comprise a trench 310 that does not extend through a bottom surface of the Al layer 306 and a via 308 that extends through the bottom surface of the Al layer 306. In some embodiments, a trench first, via first, or self-aligned dual damascene process is applied to form the openings that extend through the bottom surface of the Al layer 306.

Figure 3C:
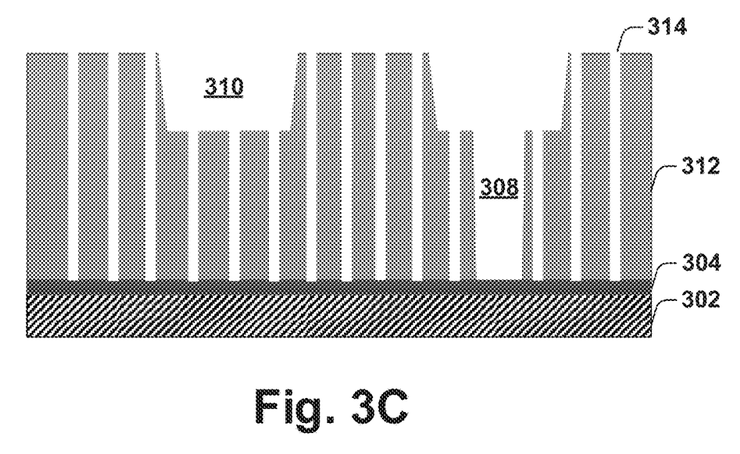

As shown in FIG. 3c, the Al layer 306 is anodized to obtain an alumina dielectric layer 312 with a plurality of pores 314. Notably, the plurality of pores 314 are substantially perpendicular to a surface of the semiconductor substrate. The Al layer 306 is anodized by applying an electric field substantially perpendicular to a surface of the semiconductor substrate.

Figure 3D:
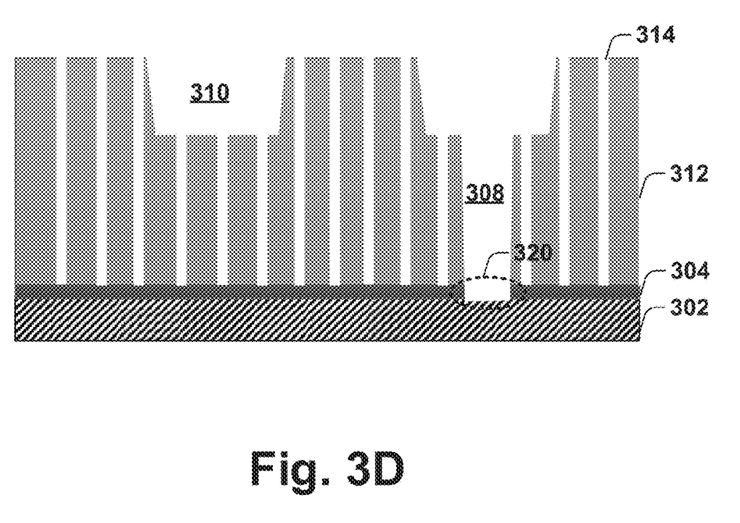

As shown in FIG. 3d, a part of the bottom ESL 320 that is under a bottom surface of the opening 308 is removed. The part 320 is kept during forming the openings to protect layers underneath from chemical reactions and is removed after anodizing.

Figure 3E:
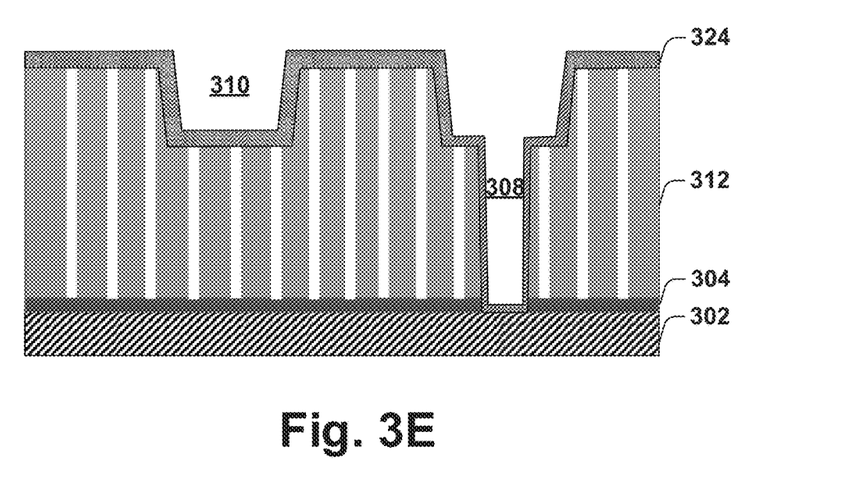

As shown in FIG. 3e, a barrier layer 324, for example, comprising Titanium (Ta), Titanium Nitride (TaN), Cobalt (Co) or their alloy is formed and/or a seed layer, for example, comprising copper, is formed substantially over a surface 330 of the alumina dielectric layer 312 without filling the pores. The barrier layer 324 remains substantially over the surface 330 of the alumina dielectric layer 312.

Figure 3F:
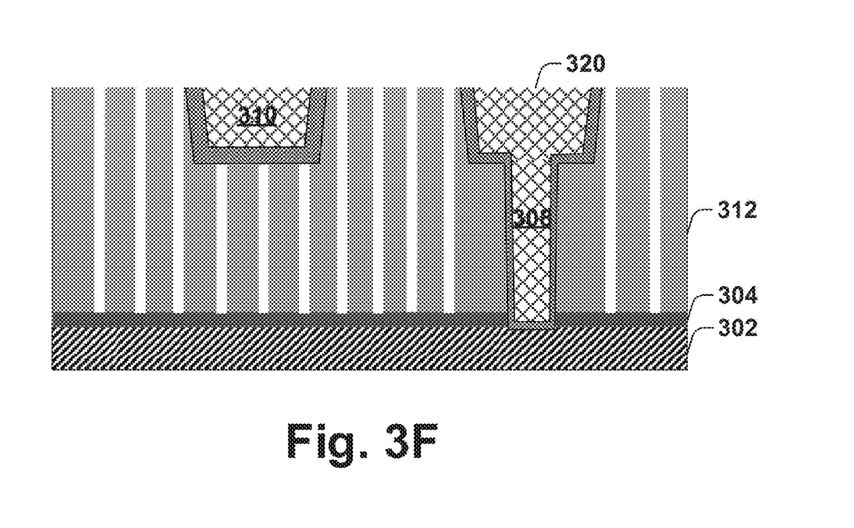

As shown in FIG. 3f, a conductive interconnect material 320, for example, copper, is used to fill the openings 308 and 310. For example, electro-plating can be used to fill the openings 308, 310 with the conductive interconnect material 320. A Chemical-Mechanical Polishing (CMP) process is applied to smooth surfaces and remove a top part that is not needed.

Figure 3G:
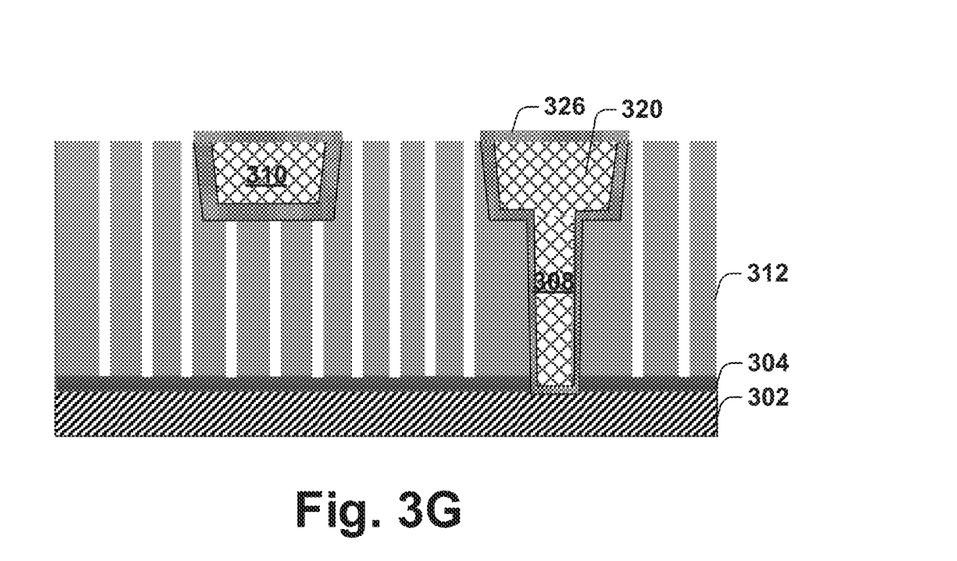

As shown in FIG. 3g, a cap layer 326, for example, comprising Co cap and a silicide material, is formed above the filled conductive interconnect material 320.

Figure 3H:
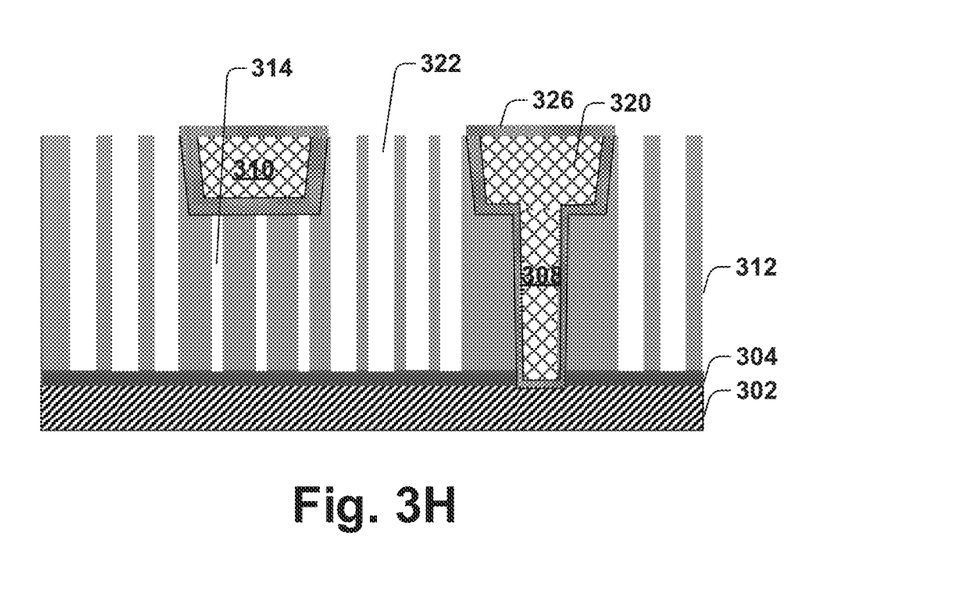

As shown in FIG. 3h, the plurality of pores are widened to form air gaps 322. Notably, in some embodiments, a plurality of pores 314 are disposed underneath the trench 310 and are not widened. Thus, pores 314 under the trench 310 can have a first average diameter, while air gaps between trenches can have a second average diameter that is larger than the first average diameter.

Figure 3I:
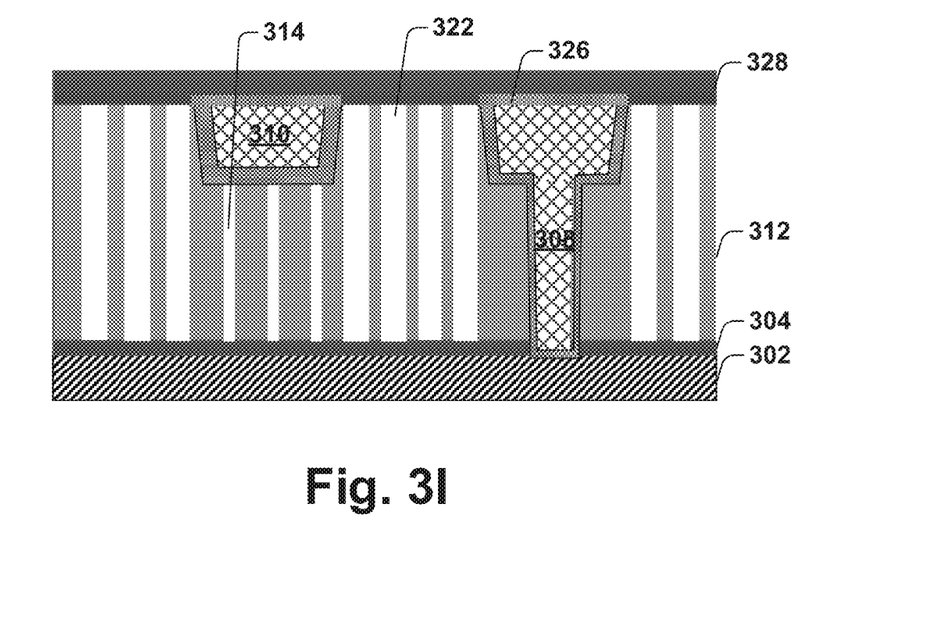

As shown in FIG. 3i, a top etch stop layer 328 is formed over the alumina dielectric layer 312.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

In some embodiments, a semiconductor device comprises a first conductive layer disposed over a semiconductor substrate and a second conductive layer disposed over the first conductive layer. An alumina dielectric layer is arranged between the first and second conductive layers to provide electrical isolation between the first and second conductive layers. The alumina dielectric layer includes an alumina matrix with a plurality of air gaps extending there through.

In other embodiments, the present disclosure relates to a method of forming an air gap for interconnect structures. The method comprises forming an aluminum (Al) layer over a semiconductor substrate, removing a selective portion of the Al layer to form openings, anodizing the Al layer to obtain an alumina dielectric layer with a plurality of pores substantially perpendicular to a surface of the semiconductor substrate, filling the openings with a conductive interconnect material, widening the pores to form air gaps and forming a top etch stop layer over the alumina dielectric layer.

In yet other embodiments, the present disclosure relates to a method of forming an air gap for interconnect structures. The method comprises forming an etch stop layer (ESL) over a semiconductor substrate, forming an aluminum (Al) layer onto the ESL, removing a selective portion of the Al layer to form openings, anodizing the Al layer to obtain an alumina dielectric layer with a plurality of pores substantially perpendicular to a surface of the semiconductor substrate, removing a part of the ESL layer that is under a bottom surface of the openings, filling the openings with a conductive interconnect material and widening the plurality of pores to form air gaps.

What is claimed is:

1. A semiconductor device comprising:
   a first conductive layer disposed over a semiconductor substrate;
   a second conductive layer disposed over the first conductive layer;
   an alumina dielectric layer arranged between the first and second conductive layers to provide electrical isolation between the first and second conductive layers, the alumina dielectric layer including an alumina matrix with a plurality of air gaps extending through the alumina matrix; and
   a copper body extending through the alumina dielectric layer to electrically couple the first conductive layer to the second conductive layer.

2. The semiconductor device of claim 1, wherein the air gaps extend substantially in parallel with one another as they extend through the alumina matrix.

3. The semiconductor device of claim 1, wherein the air gaps extend substantially perpendicular to a surface of the semiconductor substrate as they extend through the alumina matrix.

4. The semiconductor device of claim 1, wherein the air gaps in aggregate consume more than 70% of a total volume of the alumina dielectric layer and the alumina matrix consumes less than 30% of the total volume of the alumina dielectric layer.

5. The semiconductor device of claim 1, wherein the alumina dielectric layer has a dielectric constant of less than approximately 2.

6. The semiconductor device of claim 1, further comprising:
   a trench in an upper portion of the alumina dielectric layer;
   wherein the alumina dielectric layer further comprises a plurality of pores disposed under the trench and wherein the air gaps are arranged in the alumina dielectric layer on either side of the trench, wherein the plurality of pores have respective diameters which are, on average, smaller than respective diameters of the plurality of air gaps.

7. The semiconductor device of claim 6, wherein the air gaps have average diameters that approximately three times as large as average diameters of the plurality of pores.

8. The semiconductor device of claim 1, further comprising:
   a barrier layer arranged along outer sidewalls of the copper body and separating the copper body from the alumina dielectric layer.

9. The semiconductor device of claim 8, wherein the barrier layer comprises titanium, a titanium alloy, tantalum, a tantalum alloy, cobalt, or a cobalt alloy.

10. The semiconductor device of claim 1, further comprising:
a capping layer made of a different material than the copper body and disposed over an uppermost surface of the copper body, the capping layer having outer sidewalls aligned with outer sidewalls of the copper body.

11. The semiconductor device of claim 10, wherein the capping layer comprises cobalt or a silicide material.

12. A semiconductor device comprising:
a first conductive layer disposed over a substrate;
a second conductive layer disposed over the first conductive layer;
an alumina dielectric layer arranged between the first and second conductive layers to provide electrical isolation between the first and second conductive layers;
a conductive body extending through an opening in the alumina dielectric layer to electrically connect the first conductive layer to the second conductive layer; and
a barrier liner along outer sidewalls of the opening and separating the conductive body from the alumina dielectric layer.

13. The semiconductor device of claim 12, wherein the alumina dielectric layer includes an alumina matrix with a plurality of air gaps therein, wherein the air gaps in aggregate consume about 70% of a total volume of the alumina dielectric layer and the alumina matrix consumes about 30% of the total volume of the alumina dielectric layer.

14. The semiconductor device of claim 12, wherein the alumina dielectric layer has a dielectric constant of less than approximately 2.

15. The semiconductor device of claim 12, wherein the barrier liner comprises titanium, a titanium alloy, tantalum, a tantalum alloy, cobalt, or a cobalt alloy.

16. The semiconductor device of claim 12, further comprising:
a capping layer made of a different material than the conductive body and disposed over an uppermost surface of the conductive body, the capping layer having outer sidewalls aligned with outer sidewalls of the conductive body.

17. A semiconductor device comprising:
a first conductive layer disposed over a substrate;
a second conductive layer disposed over the first conductive layer; and
an alumina dielectric layer arranged between the first and second conductive layers to provide electrical isolation between the first and second conductive layers, the alumina dielectric layer including an alumina matrix with a plurality of air gaps extending through the alumina matrix;
a conductive body extending through an opening in the alumina dielectric layer to electrically connect the first conductive layer to the second conductive layer; and
a capping layer made of a different material than the conductive body and disposed over an uppermost surface of the conductive body, the capping layer having outer sidewalls aligned with outer sidewalls of the conductive body.

18. The semiconductor device of claim 17, further comprising:
a trench in an upper portion of the alumina dielectric layer;
wherein the alumina dielectric layer further comprises a plurality of pores disposed under the trench and wherein the air gaps are arranged in the alumina dielectric layer on either side of the trench, wherein the plurality of pores have respective diameters which are, on average, smaller than respective diameters of the plurality of air gaps.

19. The semiconductor device of claim 18, wherein the air gaps have average diameters that approximately three times as large as average diameters of the plurality of pores.

20. The semiconductor device of claim 17, further comprising:
a barrier layer arranged along outer sidewalls of the opening and separating the conductive body from the alumina dielectric layer, the barrier layer having an uppermost surface in contact with a lower surface of the capping layer.

* * * * *